(12) United States Patent
Basker et al.

(10) Patent No.: US 9,537,015 B2
(45) Date of Patent: Jan. 3, 2017

(54) LOCALIZED FIN WIDTH SCALING USING A HYDROGEN ANNEAL

(71) Applicants: INTERNATIONAL BUSINESS MACHINES CORPORATION, Armonk, NY (US); RENESAS ELECTRONICS CORPORATION, Kanagawa (JP)

(72) Inventors: Veeraraghavan S. Basker, Schenectady, NY (US); Shogo Mochizuki, Tokyo (JP); Tenko Yamashita, Schenectady, NY (US); Chun-Chen Yeh, Clifton Park, NY (US)

(73) Assignees: INTERNATIONAL BUSINESS MACHINES CORPORATION, Armonk, NY (US); RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/974,763

(22) Filed: Dec. 18, 2015

(65) Prior Publication Data

US 2016/0111553 A1 Apr. 21, 2016

Related U.S. Application Data

(62) Division of application No. 13/909,602, filed on Jun. 4, 2013, now Pat. No. 9,263,554.

(51) Int. Cl.
*H01L 29/78* (2006.01)
*H01L 29/786* (2006.01)
(Continued)

(52) U.S. Cl.
CPC ..... *H01L 29/78696* (2013.01); *H01L 21/3247* (2013.01); *H01L 29/0676* (2013.01); *H01L 29/41733* (2013.01); *H01L 29/41791* (2013.01); *H01L 29/42384* (2013.01); *H01L 29/42392* (2013.01); *H01L 29/66795* (2013.01);
(Continued)

(58) Field of Classification Search
USPC ........................................................ 257/401
See application file for complete search history.

(56) References Cited

U.S. PATENT DOCUMENTS 6,764,884 B1 7/2004 Yu et al.
6,812,075 B2 11/2004 Fried et al.
(Continued)

OTHER PUBLICATIONS

Kawasaki, H., et al. "Challenges and Solutions of FinFET Integration in an SRAM Cell and a Logic Circuit for 22 NM Node and Beyond" Electron Devices Meeting (IEDM), 2009 IEEE International. Dec. 2009. (4 Pages).
(Continued)

*Primary Examiner* — Minh-Loan Tran
(74) *Attorney, Agent, or Firm* — Tutunjian & Bitetto, P.C.; Vazken Alexanian

(57) ABSTRACT

Transistors including one or more semiconductor fins formed on a substrate. The one or more semiconductor fins are thinner in a channel region than in source and drain regions and have rounded corners formed by an anneal in a gaseous environment. A gate dielectric layer is on the channel region of the one or more semiconductor fins, conforming to the contours of the one or more semiconductor fins. A gate structure is on the gate dielectric layer.

10 Claims, 4 Drawing Sheets

(51) Int. Cl.
   *H01L 29/66*     (2006.01)
   *H01L 29/417*    (2006.01)
   *H01L 29/423*    (2006.01)
   *H01L 21/324*    (2006.01)
   *H01L 29/06*     (2006.01)

(52) U.S. Cl.
   CPC ...... *H01L 29/66818* (2013.01); *H01L 29/785* (2013.01); *H01L 29/7831* (2013.01); *H01L 29/7854* (2013.01); *H01L 29/7856* (2013.01)

(56) References Cited

U.S. PATENT DOCUMENTS

| | | |
|---|---|---|
| 6,924,178 B2 | 8/2005 | Beintner |
| 7,087,471 B2 | 8/2006 | Beintner |
| 7,186,599 B2 | 3/2007 | Ahmed et al. |
| 7,550,333 B2 | 6/2009 | Shah et al. |
| 7,554,165 B2 | 6/2009 | Hokazono |
| 7,622,354 B2 | 11/2009 | Dreeskornfeld et al. |
| 8,941,155 B2* | 1/2015 | Kang ................. H01L 29/7851 257/288 |
| 2009/0309162 A1* | 12/2009 | Baumgartner .... H01L 29/66818 257/368 |
| 2010/0276761 A1* | 11/2010 | Tung ................. H01L 29/41791 257/384 |
| 2013/0221491 A1* | 8/2013 | Wann ............. H01L 21/823431 257/618 |

OTHER PUBLICATIONS

Keshavarzi, A., et al. "Architecting Advanced Technologies for 14NM and Beyond With 3D FinFET Transistors for the Future SOC Applications" Electron Devices Meeting (IEDM), 2011 IEEE International. Dec. 2011. (4 Pages).

* cited by examiner

LOCALIZED FIN WIDTH SCALING USING A HYDROGEN ANNEAL

BACKGROUND

Technical Field

The present invention relates to transistor fabrication and, more particularly, to the fabrication of transistors with thinned channel fins.

Description of the Related Art

Limits on length of gates in fin field effect transistors (FinFETs) are imposed by fin width. As the gate length decreases, short channel current leakage increases. Because new technologies are capable of forming progressively smaller transistors, these short channel effects become significant challenges in transistor design. Forming transistors with thinner fins helps enhance gate control over the transistor channel, thereby reducing current leakage.

However, uniformly decreasing the size of fins presents its own challenges. When the width of a fin is reduced, current crowding at the fin's exterior increases. This increases the effective resistance of the thinner fin, which impacts the drive current performance of the FinFET. This compromises the benefits to the subthreshold leakage control provided by having a thinner fin.

Existing processes for thinning fins include oxidation. However, such thinning processes may undercut spacers around the channel region, resulting in physical faults or defects in the resulting transistors. As such, existing oxidation processes are inadequate for producing small-scale devices.

SUMMARY

A transistor includes one or more semiconductor fins formed on a substrate, wherein the one or more semiconductor fins are thinner in a channel region than in source and drain regions and have rounded corners formed by an anneal in a gaseous environment; a gate dielectric layer on the channel region of the one or more semiconductor fins, conforming to the contours of the one or more semiconductor fins; and a gate structure on the gate dielectric layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 2:
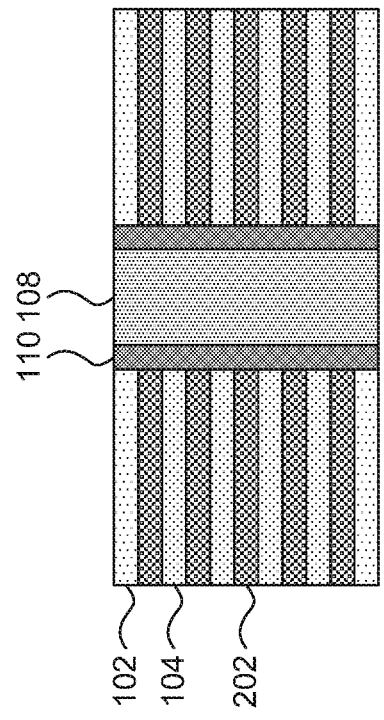
FIG. 2 is a top-down view of a step in forming a locally thinned channel FinFET in accordance with the present principles.

The present principles provide fin field effect transistors (FinFETs) that have fins with reduced width localized to the channel region. Short channel effects in transistors can be controlled if $W_{fin} < 0.7 L_{gate}$, where $W_{fin}$ is the width of the fin and $L_{gate}$ is the length of the gate. Current crowding is a further concern, because reducing the fin width in the area of the source and drain region can cause a nonhomogeneous distribution of current density, which can lead to an increased effective resistance and shortened device lifetime.

To keep fin widths low and allow for further reduction in gate length, the present principles apply a hydrogen anneal that removes material only from the channel region of the fins, preserving the width of the fins in the source/drain region. In this way, leakage current in the transistor's off state is reduced without increasing the exterior resistance of the fins in the source and drain regions. The fins are epitaxially grown in the source/drain regions to bring them into contact. The thinning provided by the present principles is compatible with standard replacement gate FinFET process flows, with no additional maskset being needed.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly.

The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
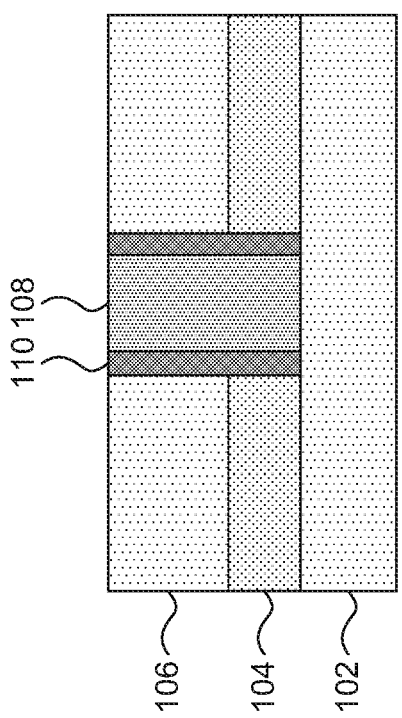
FIG. 1 is a cross-sectional view of a step in forming a locally thinned channel FinFET in accordance with the present principles.

Referring now to the drawings in which like numerals represent the same or similar elements and initially to FIG. 1, a step in forming a locally thinned channel FinFET is shown. This view shows a cut-away perspective along fins 104. Fins 104 are formed on a substrate 102. The substrate 102 may be formed from a bulk semiconductor, such as silicon or germanium. The substrate 102 may also be formed from alternative semiconductor materials such as a silicon-germanium composite, silicon carbide, or a III-V composite semiconductor such as gallium arsenide or indium arsenide. The substrate 102 may be a semiconductor on insulator substrate, where a semiconductor layer is formed on top of a dielectric material such as, e.g., silicon dioxide. In the present embodiments, a semiconductor-on-insulator structure is shown, with a buried oxide layer 102 supporting semiconductor fins 104. A top dielectric layer 106 is formed over the fins 104 and may include, e.g., silicon dioxide or any other appropriate insulating material. The top dielectric layer 106 is, e.g., a flowable oxide layer that serves to protect the fins 104 during a gate replacement process.

The fins 104 may be formed from any appropriate fabrication process. In particular, it is contemplated that the fins 104 may be etched from a layer of semiconductor using a lithographic or reverse ion etching process. Those having ordinary skill in the art will be able to select an appropriate mask and etch according to the particular materials used.

Spacers 110 separate a region of fins 104 that will form the channel. The spacers 110 may be formed from an appropriate hardmask material such as, e.g., silicon nitride. A dummy gate structure 108 is formed over the fins 104 in the channel region to protect them to this stage and may be formed from any appropriate material including, e.g., polysilicon.

Referring now to FIG. 2, a step in forming a locally thinned channel FinFET is shown. This view shows a top-down perspective on the fins 104 with the top dielectric layer 106 removed for the sake of illustration. The fins 104 are epitaxially grown to form bridging connections 202, thereby merging the fins 104 in the source/drain region. The epitaxial growth causes each fin 104 to expand from its sides until the fins 104 come into contact.

Figure 3:
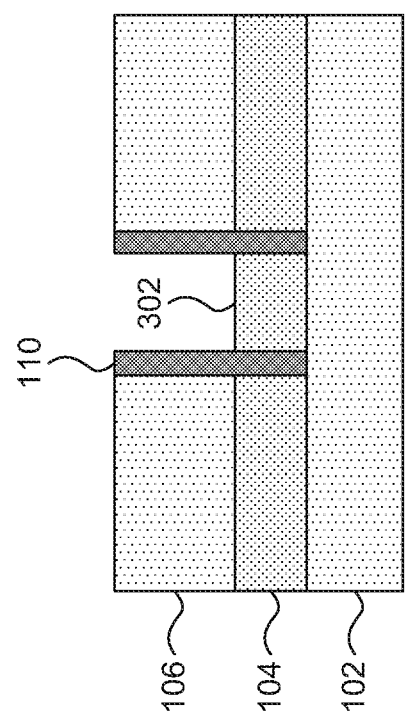
FIG. 3 is a cross-sectional view of a step in forming a locally thinned channel FinFET in accordance with the present principles.

Referring now to FIG. 3, a step in forming a locally thinned channel FinFET is shown. The dummy gate 108 is removed using, e.g., a wet etch or polysilicon chemical mechanical polish, exposing the channel region 302 of the fins 104. If the fins 104 had caps, those caps may be removed using any appropriate process including, e.g., a chemical oxide removal process. The top dielectric layer 106 remains over the fins 104 in the source/drain regions, protecting these portions of the fins 104. At this point, an anneal may be performed that thins the fins 104 only in the channel region 302. The anneal may be performed using, e.g., hydrogen ($H_2$) in a high-temperature, low-pressure environment. The anneal causes fin material in the channel region 302 to be removed. In an embodiment where the fins 104 are formed from silicon and a hydrogen anneal is used, the chemical reaction is either $Si+H_2 \rightarrow SiH_2$ or $Si+2H_2 \rightarrow SiH_4$. The hydrogen anneal produces superior results to fin thinning produced by, e.g., oxidation processes, which would undercut the spacers 110 and separate them from the substrate 102. It should be recognized that this anneal will also work on non-silicon semiconductor materials such as germanium or III-V composite semiconductors.

In an exemplary anneal, hydrogen gas is applied at a temperature of about 800 degrees Celsius at a pressure of 10 Torr for 300 seconds. As will be described in greater detail below, the quality of a given set of anneal parameters may be quantified as the line edge roughness (LER) of the fins 104 in the channel region 302. Fins 104 in a realistic embodiment will not be truly straight—the anneal helps to smooth the fins 104 and decrease LER. Anneals performed at temperatures that are too high (e.g., 850 degrees Celsius) cause too much reflow in the material of the fins 104 and may cause the LER to increase again.

It should be noted that an anneal under these conditions may cause longer fins to migrate. When fins 104 migrate, the fins 104 may physically break away from their place on substrate 102 and merge with a neighboring fin 104. This concern is less prominent in the present embodiments due to the short length of the fins of the channel region 302.

Figure 4:
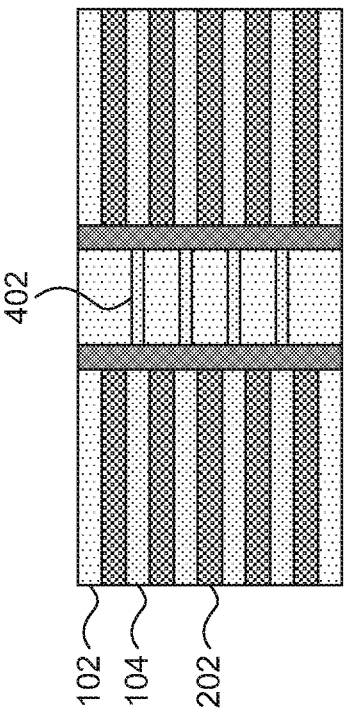
FIG. 4 is a top-down view of a step in forming a locally thinned channel FinFET in accordance with the present principles.

Referring now to FIG. 4, a step in forming a locally thinned channel FinFET is shown. Again, the top dielectric layer 106 is not shown in this top-down view to illustrate the thinning of the fins 104. In particular, the anneal removes material only from the fins in the channel region, producing thinned channel fins 402, without the epitaxially grown semiconductor material 202 to connect them. The fins 402 may be thinned to about 10 nm to about 8 nm. Thinning to smaller widths than this can impede functionality, as the threshold voltage of a transistor will increase due to quantum effects and carrier mobility penalties when the fins 402 are about 5 nm thick.

Figure 5:
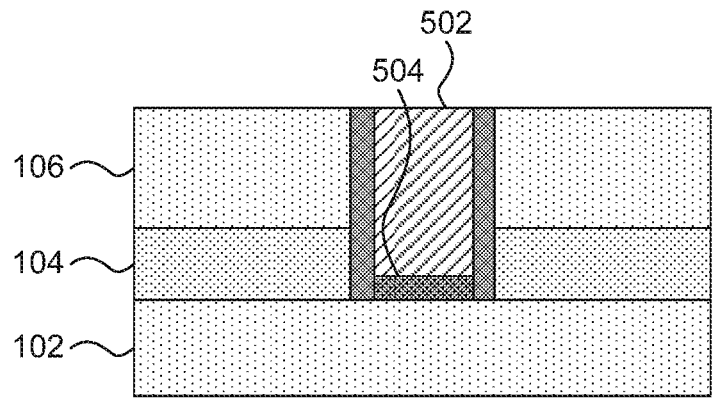
FIG. 5 is a cross-sectional view of a step in forming a locally thinned channel FinFET in accordance with the present principles.

Referring now to FIG. 5, a step in forming a locally thinned channel FinFET is shown. A dielectric layer 504 is deposited in the channel region 302 conforming to the contours of thinned fins 402. The dielectric layer 504 may be formed from any appropriate dielectric material including, e.g., a high-k dielectric such as hafnium dioxide, hafnium silicate, zirconium dioxide, or zirconium silicate. The dielectric layer 504 may be formed using any appropriate deposition process such as, e.g., chemical vapor deposition (CVD), atomic layer deposition (ALD), or physical vapor deposition (PVD). A gate 502 is formed over the dielectric layer 504. It is specifically contemplated that the gate 502 may be a metal gate formed from, e.g., tantalum, tantalum nitride, niobium, etc.

Figure 6:
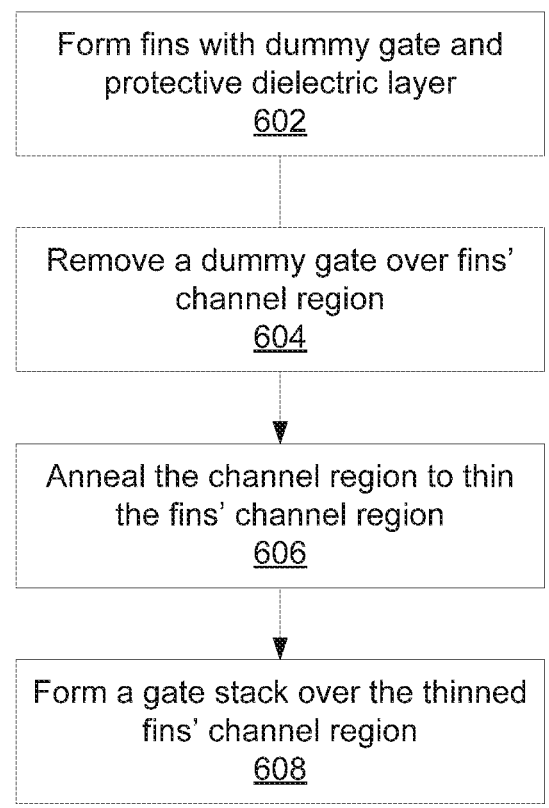
FIG. 6 is a block/flow diagram of a method of forming a locally thinned channel FinFET in accordance.

Referring now to FIG. 6, a method for forming a locally thinned channel FinFET is shown. As shown above, a standard FinFET process may be used to produce fins in block 602, where the source/drain regions of the fins 104 are protected by a top dielectric layer 106 and the channel region 302 of the fins 104 is covered by a dummy gate 108. Block 604 removes the dummy gate 108 to uncover the channel region 302 of the fins 104.

As described above, block 606 performs an anneal using, e.g., hydrogen gas, to remove material from the fins 104 in the channel region 302. It is specifically contemplated that the anneal may be performed at 800 degrees Celsius and a pressure of 10 Torr. Those having ordinary skill in the art will be able to select an appropriate duration for the anneal according to the size and thickness of the fins 104. After the anneal, thinned fins 402 are covered by a gate stack in block 608 by applying a dielectric layer 504 and a gate material 502.

The present principles enhance the shape of the fins 104 in multiple ways. The hydrogen anneal described above improves uniformity in the profile of the fins 104 and also improves the morphology along the direction of the fins 104, described above as the LER.

Figure 7:
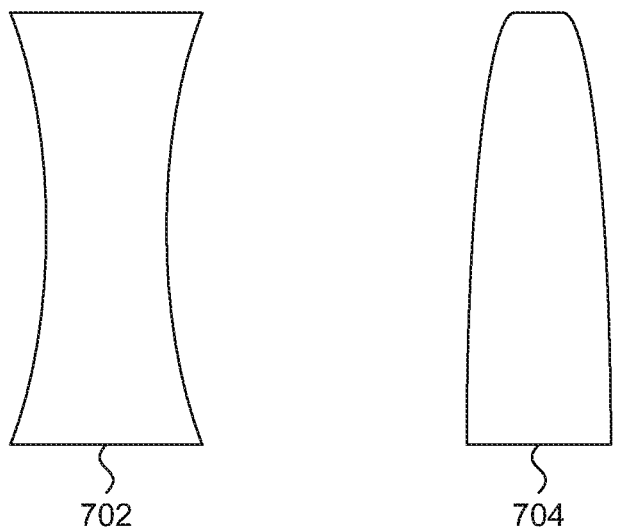
FIG. 7 is a cross-sectional view of fins before and after annealing in accordance with the present principles.

Referring now to FIG. 7, a cross-section of two fins is shown, pre- and post-anneal. A first fin, 702, shows an exemplary fin before anneal, where the chemical etch that produced the fin 702 left irregularities in the fin profile. The anneal reduces the irregularities, producing an improved fin profile 704. The anneal also reduces the overall fin width in proportion to the anneal's duration. Suboptimal fin profiles lead to increased irregularities along the sides of the fins. In particular, it should be noted that the anneal has removed the concavities of the fin profile in 702, such that the resulting fin profile is entirely convex.

In one experimental trial, initial fin width was measured at the top, middle, and bottom with widths of 9.231 nm, 8.951 nm, and 10.91 nm respectively, at a height of 27.97 nm and having relatively sharp corners. As shown in fin 702, the top and bottom measurements were greater than the middle width, producing a concave cross-section, which is not optimal. After annealing, the fin had measurements of 6.373 nm, 6.918 nm, and 7.397 nm respectively, with a height of 26.81 nm and rounded corners. In addition to an overall reduction in width, this produces the superior profile shown as fin 704 with better electrical properties than the original fin 702. Notably, this profile is most effectively formed in a low-pressure environment.

Experiments with high-pressure environments have resulted in a fin profile that bulges in the middle, with a middle width greater than the width of the top and bottom. In one exemplary test, a pressure of 600 Torr was used, resulting in widths of 7.84 nm, 8.64 nm, and 8.25 nm respectively. Similarly, anneals at temperatures higher than about those discussed above (e.g., at 850 degrees Celsius) result in similar bulges in the middle width measurement post-anneal.

Figure 8:
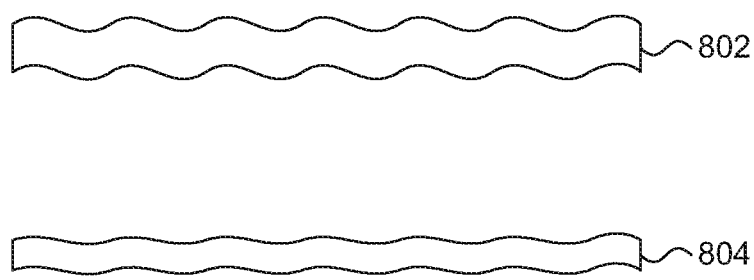
FIG. 8 is a top-down view of fins before and after annealing in accordance with the present principles.

Referring now to FIG. 8, a top-down view of two fins is shown, pre- and post-anneal. A first fin 802 shows an exemplary fin before anneal, where the formation of the fin 802 produced surface irregularities. The irregularities are shown here as "wavy" sides and may be quantified by a measure of the LER, where LER may be defined as the root-mean-squared of the fin's edge. After the anneal, the thinned fins 804 exhibit decreased LER because convex portions of the fins 802 are preferentially etched in the anneal. Rough surfaces may impede carrier transport and thereby increase the resistance of the channel fins 402.

Figure 9:
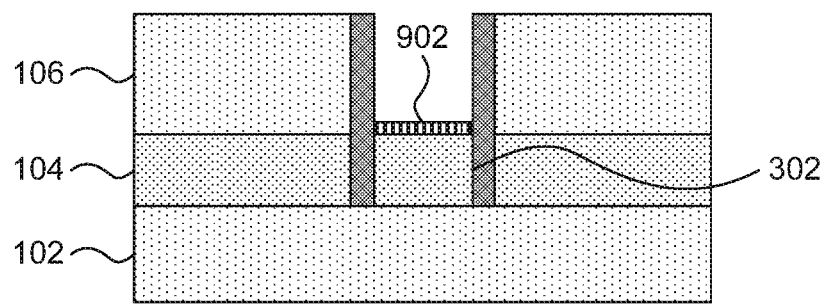
FIG. 9 is a cross-sectional view of a step in forming a locally thinned channel FinFET in accordance with the present principles.

Referring now to FIG. 9, an alternative embodiment of a step in forming a locally thinned channel FinFET is shown. In this embodiment, an oxide capping layer 902 is left on the fins 104. The presence of a capping layer 902 may help prevent damage to the fins 104 during the anneal. The hydrogen anneal may be performed with the oxide cap 902 remaining on the fins 104, such that the oxide cap 902 is etched and thinned along with the fins in the channel region 302.

Figure 10:
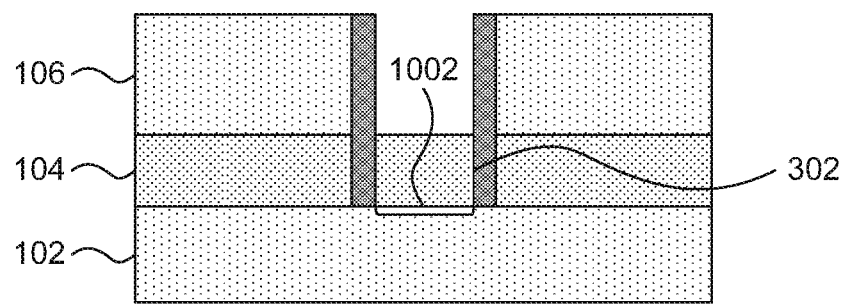
FIG. 10 is a cross-sectional view of a step in forming a locally thinned channel FinFET in accordance with the present principles.

Referring now to FIG. 10, an optional step in forming a locally thinned channel FinFET is shown. After the removal of dummy gate 108, the substrate layer 102 may be etched to expose the underside of the channel region 302 of the fins 104. This allows the formation of nanowires from the fins 104 by rounding the rough edges after the hydrogen anneal. The etch of the fins 104 into nanowires may be performed by any appropriate process including, e.g., a wet etch that preferentially etches and softens the corners of the fins 104.

Figure 11:
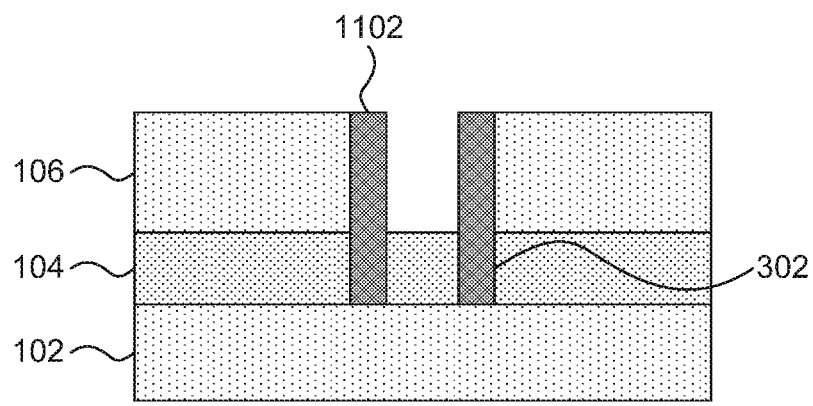
FIG. 11 is a cross-sectional view of a step in forming a locally thinned channel FinFET in accordance with the present principles.

Referring now to FIG. 11, an optional step in forming a locally thinned channel FinFET is shown. After removal of the dummy gate 108, additional liner material is deposited and etched from the channel region 302 to increase the width of spacers 1102. The additional liner material should match the material of spacers 110 and thus may be, for example, formed from silicon nitride.

Increasing the width of spacers 1102 helps provide additional protection for fins 104 in the source and drain regions by preventing hydrogen gas from seeping inward during the anneal process. Allowing the hydrogen to etch into the source and drain regions could result in thinning of the fins 104 in these regions and cause dopant loss. The loss of dopant in these regions would mean a higher resistance and decreased functionality for the finished device.

Having described preferred embodiments of localized fin width scaling using a hydrogen anneal (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transistor, comprising:
   one or more semiconductor fins formed on a substrate, wherein the one or more semiconductor fins are thinner in a channel region than in source and drain regions and have rounded corners formed by an anneal in a gaseous environment;
   a gate dielectric layer on the channel region of the one or more semiconductor fins, conforming to the contours of the one or more semiconductor fins; and
   a gate structure on the gate dielectric layer.

2. The transistor of claim 1, further comprising spacers over the one or more semiconductor fins separating the channel region from a respective source or drain region.

3. The transistor of claim 2, wherein the spacers contact the substrate without undercut.

4. The transistor of claim 2, further comprising a shielding spacer layer that thickens the spacers to protect the source and drain regions of the one or more semiconductor fins from etching.

5. The transistor of claim 1, wherein a plurality of semiconductor fins are merged in the source and drain regions with epitaxially grown additional fin material that connects original material of the plurality of semiconductor fins.

6. The transistor of claim 1, wherein a profile of the one or more semiconductor fins is entirely convex.

7. The transistor of claim 6, wherein the profile of the one or more semiconductor fins is widest at the bottom and tapers toward the top.

8. The transistor of claim 1, wherein the one or more semiconductor fins are hydrogen-annealed at about 800 degrees Celsius and at a pressure of about 10 Torr.

9. The transistor of claim 1, wherein there is an undercut gap between the one or more semiconductor fins and the substrate and wherein the one or more semiconductor fins are rounded to form nanowires.

10. The transistor of claim 1, wherein further comprising an oxide capping layer on the one or more semiconductor fins.

* * * * *